(12) United States Patent
Niemann et al.

(10) Patent No.: US 9,326,369 B2
(45) Date of Patent: Apr. 26, 2016

(54) GUARDED PRINTED CIRCUIT BOARD ISLANDS

(71) Applicant: Keithley Instruments, Inc., Cleveland, OH (US)

(72) Inventors: James A. Niemann, Chagrin Falls, OH (US); Gregory Sobolewski, Brecksville, OH (US); Martin J. Rice, Sagamore Hills, OH (US); Wayne Goeke, Hudson, OR (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 132 days.

(21) Appl. No.: 13/921,550

(22) Filed: Jun. 19, 2013

(65) Prior Publication Data

US 2014/0376201 A1 Dec. 25, 2014

(51) Int. Cl.
*H05K 1/02* (2006.01)
*H05K 3/40* (2006.01)
*H05K 3/46* (2006.01)
*H05K 3/30* (2006.01)
*H05K 1/14* (2006.01)

(52) U.S. Cl.
CPC ............ *H05K 1/0213* (2013.01); *H05K 1/0256* (2013.01); *H05K 1/142* (2013.01); *H05K 3/306* (2013.01); *H05K 3/4038* (2013.01); *H05K 3/4697* (2013.01); *H05K 1/0225* (2013.01); *H05K 1/145* (2013.01); *H05K 2201/0792* (2013.01); *H05K 2201/093* (2013.01); *H05K 2201/09063* (2013.01); *H05K 2201/0969* (2013.01); *H05K 2201/09618* (2013.01); *H05K 2201/09981* (2013.01); *Y10T 29/49139* (2013.01)

(58) Field of Classification Search
CPC ...... H05K 3/306; H05K 1/0213; H05K 1/142
USPC .......................... 174/261, 262; 361/760, 816
See application file for complete search history.

(56) References Cited

U.S. PATENT DOCUMENTS

| | | | |
|---|---|---|---|
| 5,298,684 A * | 3/1994 | Leeb | 174/250 |
| 5,490,325 A * | 2/1996 | Niemann et al. | 29/846 |
| 6,377,464 B1 * | 4/2002 | Hashemi et al. | 361/760 |

(Continued)

FOREIGN PATENT DOCUMENTS

JP          H0955571 A          2/1997

OTHER PUBLICATIONS

Extended European Search Report for European Patent Application No. 14172907.9, dated Nov. 11, 2014, 8 pages, The Hague.

*Primary Examiner* — William H Mayo, III
*Assistant Examiner* — Hiram E Gonzalez
(74) *Attorney, Agent, or Firm* — Marger Johnson (57) ABSTRACT

A device with low dielectric absorption includes a printed circuit board (PCB), a component connection area including a first conductor layered on a top surface of the component connection area and a second conductor layered on a bottom surface of the component connection area, an aperture surrounding the component connection area, a low-leakage component connecting the component connection area to the PCB across the aperture, and a guard composed of a third conductor at least substantially surrounding the aperture on a top surface of the PCB and a fourth conductor at least substantially surrounding the aperture on a bottom surface of the PCB.

17 Claims, 9 Drawing Sheets

(56) References Cited

U.S. PATENT DOCUMENTS

| | | | |
|---|---|---|---|
| 6,700,789 B2 * | 3/2004 | Shirasaki | 361/748 |
| 6,706,624 B1 * | 3/2004 | Kapusta et al. | 438/622 |
| 6,977,346 B2 * | 12/2005 | Jairazbhoy et al. | 174/252 |
| 7,525,813 B2 * | 4/2009 | Kohjiro et al. | 361/760 |

* cited by examiner

GUARDED PRINTED CIRCUIT BOARD ISLANDS

TECHNICAL FIELD

This disclosure relates to precision electrical measurement devices and in particular to component connection points that provide very low dielectric absorption.

BACKGROUND

In devices for measuring very low currents, conventional printed circuit board (PCB) designs absorbed unacceptable numbers of electrons or other charge carriers at the low current nodes of the devices. This absorption is referred to as dielectric absorption.

Electric fields (E-fields) are responsible for leakage displacement currents. Leakage displacement currents follow the path of E-fields through the PCB material. As an E-field persists through the material of the PCB, the material relaxes and the polar molecules of the material align with the E-field. When the E-field is removed, the polar molecules of the material of the PCB return to a randomized state. The alignment and return to randomization, however, can take an extended period of time. It is desirable to prevent the E-field from penetrating the PCB material involved with very low current measurements.

Figure 1:
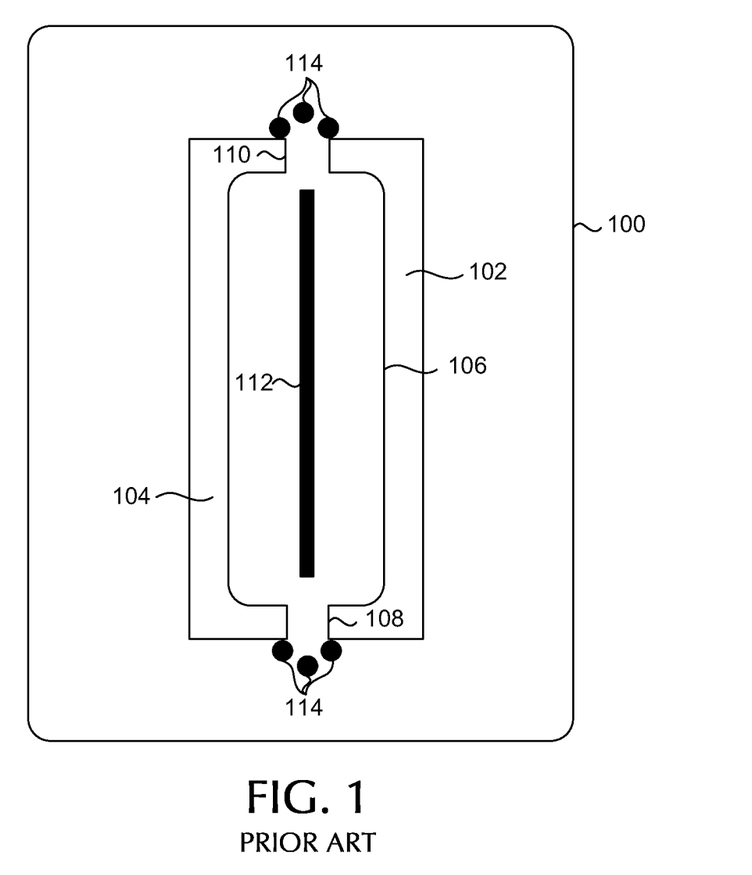
FIG. 1 is a partial plan view of a prior art printed circuit board using islands.

Conventional methods reduce the current leakage by replacing most of the PCB dielectric material with air, as shown in FIG. 1 and discussed in U.S. Pat. No. 5,490,325. FIG. 1 shows a PCB 100 with apertures 102 and 104 surrounding an island 106. The island is held in place by two stems 108 and 110. A circuit board trace 112 is provided in the middle of the island. Guards 114 may also be provided near the two stems 108 and 110 to provide a sink for charge collected by the walls of the apertures 108 and 110.

Figure 2:
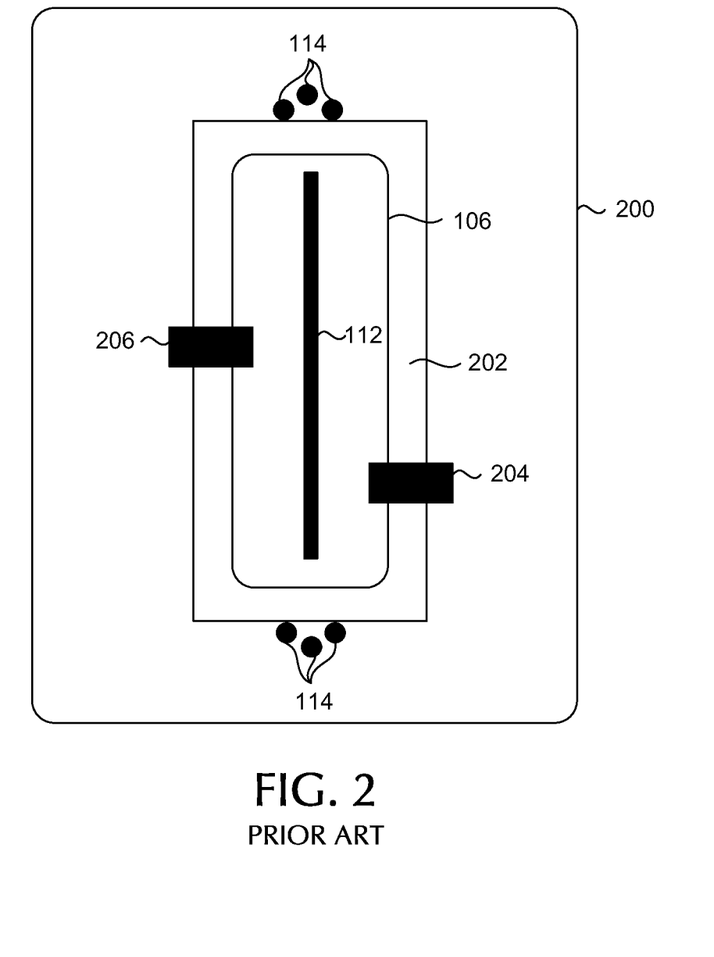
FIG. 2 is a partial plan view of another prior art printed circuit board using islands.

Another conventional method to reduce the current leakage is shown in FIG. 2. In this configuration, a PCB 100 is provided with an island 106 surrounded by an aperture 202. The island 106 is connected to the PCB 100 by low-leakage components 204 and 206. A circuit board trace 112 and guards 114 are provided in this configuration as well. The two stems 108 and 110 are removed once the components are in place. In these prior art devices, however, a reduction in current leakage was accomplished by routing out islands. E-field lines still flowed through the PCB material and the PCB material still aligned with the E-field. Even with the island technique, it still would take a significant amount of time for the polar molecules of the PCB material to randomize after voltage is no longer applied.

SUMMARY

Certain embodiments of the disclosed technology include a device including a printed circuit board (PCB), a component connection area including a first conductor layered on a top surface of the component connection area and a second conductor layered on a bottom surface of the component connection area, an aperture at least substantially surrounding the component connection area, a low-leakage component connecting the component connection area to the PCB across the aperture, and a guard composed of a third conductor surrounding the aperture on a top surface of the PCB and a fourth conductor surrounding the aperture on a bottom surface of the PCB.

Other embodiments include a method for providing on a printed circuit board (PCB) a component connection area of the PCB having low dielectric absorption by creating an aperture in the PCB at least substantially surrounding the component connection area and providing a low-leakage component to connect the component connection area to the PCB across the aperture. A first conductor is provided on a top surface of the component connection area and a second conductor is provided on a bottom surface of the component connection area and a guard is created on the PCB at least substantially surrounding the aperture, the guard composed of a third conductor on a top surface of the PCB and a fourth conductor on a bottom surface of the PCB.

DETAILED DESCRIPTION

In the drawings, which are not necessarily to scale, like or corresponding elements of the disclosed systems and methods are denoted by the same reference numerals.

Figure 3:
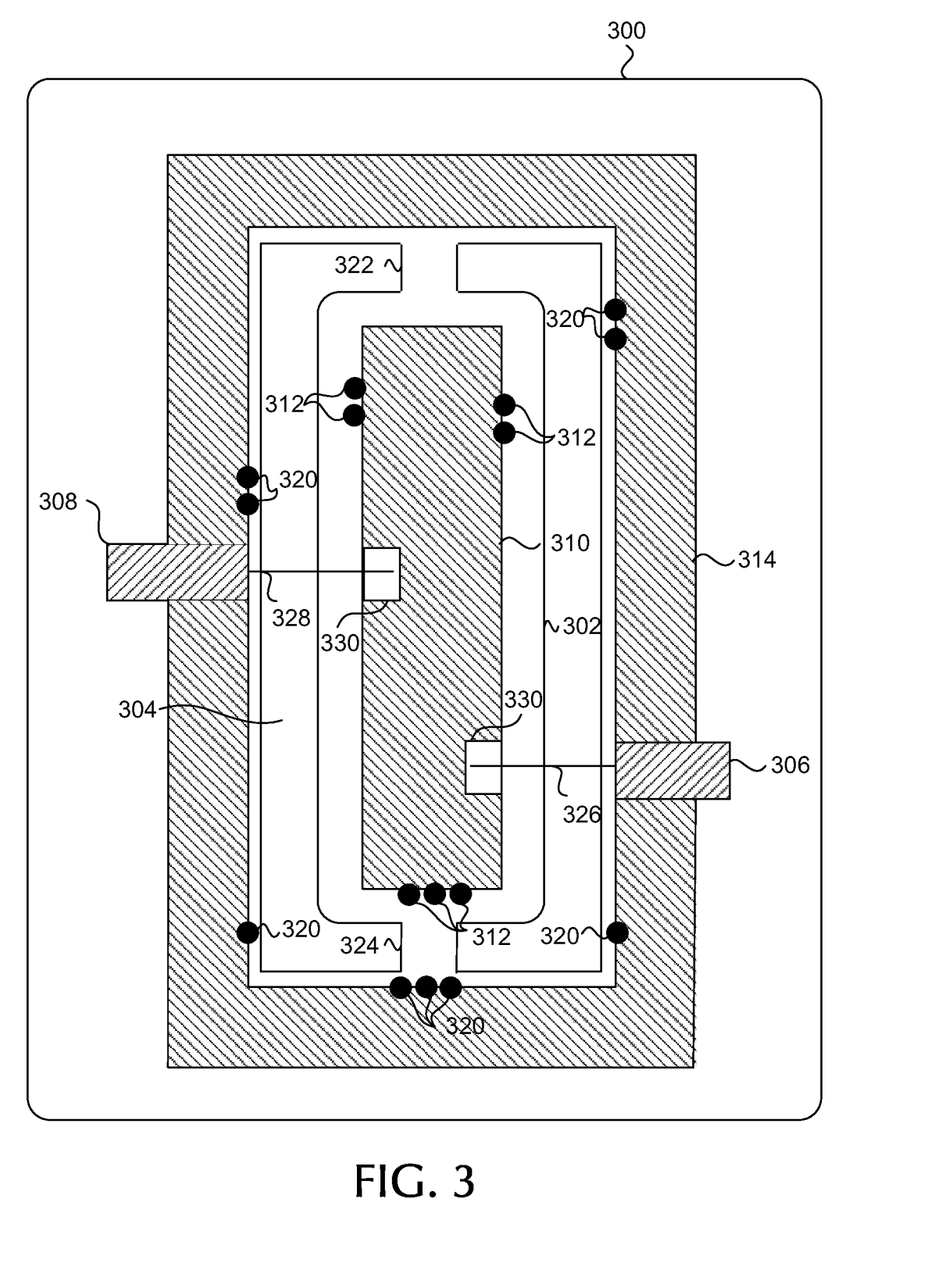
FIG. 3 is a plan view of a printed circuit board according to certain embodiments of the disclosed technology.
Figure 9:
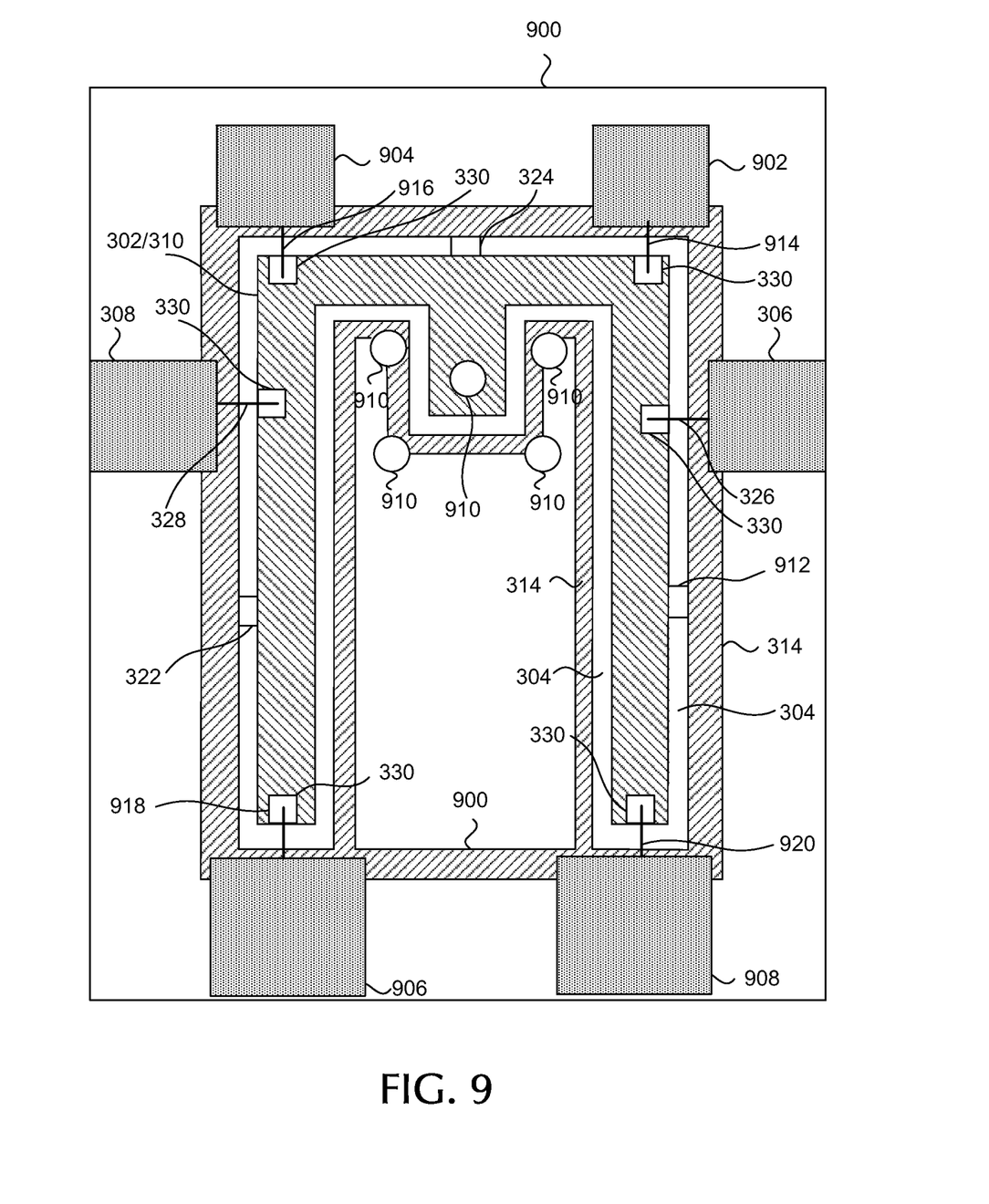
FIG. 9 is a plan view of a printed circuit according to other embodiments of the disclosed technology.

In order to reduce the amount of E-field lines flowing through the material of the PCB, the disclosed PCBs use mostly air as the dielectric. Referring to FIG. 3, for example, a PCB 300 contains a component connection area 302, also known as an island. An aperture 304 is provided substantially surrounding the component connection area 302. The component connection area 302 is connected to the PCB 300 by pins 326 and 328 of a low-leakage components 306 and 308, respectively, at soldering points 330. That is, the low-leakage components 306 and 308 span across the aperture 304 to connect the PCB 300 and the component connection area 302. The other pins on the low-leakage components 306 and 308 may be connected to other islands not shown. In the example, narrow stems 322 and 324 connect the component connection area 302 to the PCB 300. However, in alternative embodiments, either or both of stems 322 and 324 may be removed after the components are added so that the component connection area is 302 is held in place partially or solely by components 306 and 308. Further, more than two low-leakage components may be used to connect the component connection area 302 to PCB 300 (as shown in FIG. 9).

The component connection area 302 includes a first conductor 310 on the top surface of the component connection area 302. The component connection area 302 is also provided with connection points (not shown) to connect components. The bottom surface of the component connection area 302 includes a second conductor 316 (shown in FIG. 6) that may be substantially identical to the first conductor 310 on the top surface of the component connection area 302. Preferably, the first conductor 310 and the second conductor 316 are connected through at least one via 312. As shown in FIG. 3, a plurality of vias 312 may be provided around the perimeter of the component connection area 302 closest to the aperture 304. The first conductor 310 and the second conductor 316 preferably cover a majority of the component connection area 302 so very little PCB material is uncovered, as shown in FIG. 3.

The component connection area 302 may be as small as a few tenths of an inch in length. Longer component connection areas 302 may be used including, but not limited to, a length of several inches. Because longer component connection areas 302 may weaken PCB 300, it is generally preferable to use smaller lengths.

A top guard 314 and bottom guard 318 (shown in FIG. 6) are also provided surrounding aperture 304 on PCB 300, as shown in FIG. 3. Preferably, low-leakage components 306 and 308 are placed over the top guard 314. Preferably, the top guard 314 and the bottom guard 318 are connected through a via 320. As shown in FIG. 3, a plurality of vias 320 may be provided around the perimeter of the aperture 304 to connect the top guard 314 and the bottom guard 318 at a plurality of different locations. The top guard 314 and the bottom guard 318 are each at least as wide as the width of the aperture. The top guard 314 and the bottom guard 318 are each driven by a circuit to a voltage that is or nearly is identical to the voltage of the component connection area 302. The E-fields from the component connection area 302 to circuitry on PCB 300 beyond the top guard 314 and the bottom guard 318 are through the air over the top guard 314 and the bottom guard 318. Therefore, the E-fields do not extend through the PCB material of PCB 300.

Although the bottom portion of the PCB 300 of FIG. 3 has not been shown, one of ordinary skill in the art will readily recognize that the bottom portion would be substantially a mirror image of the top portion.

Figure 4:
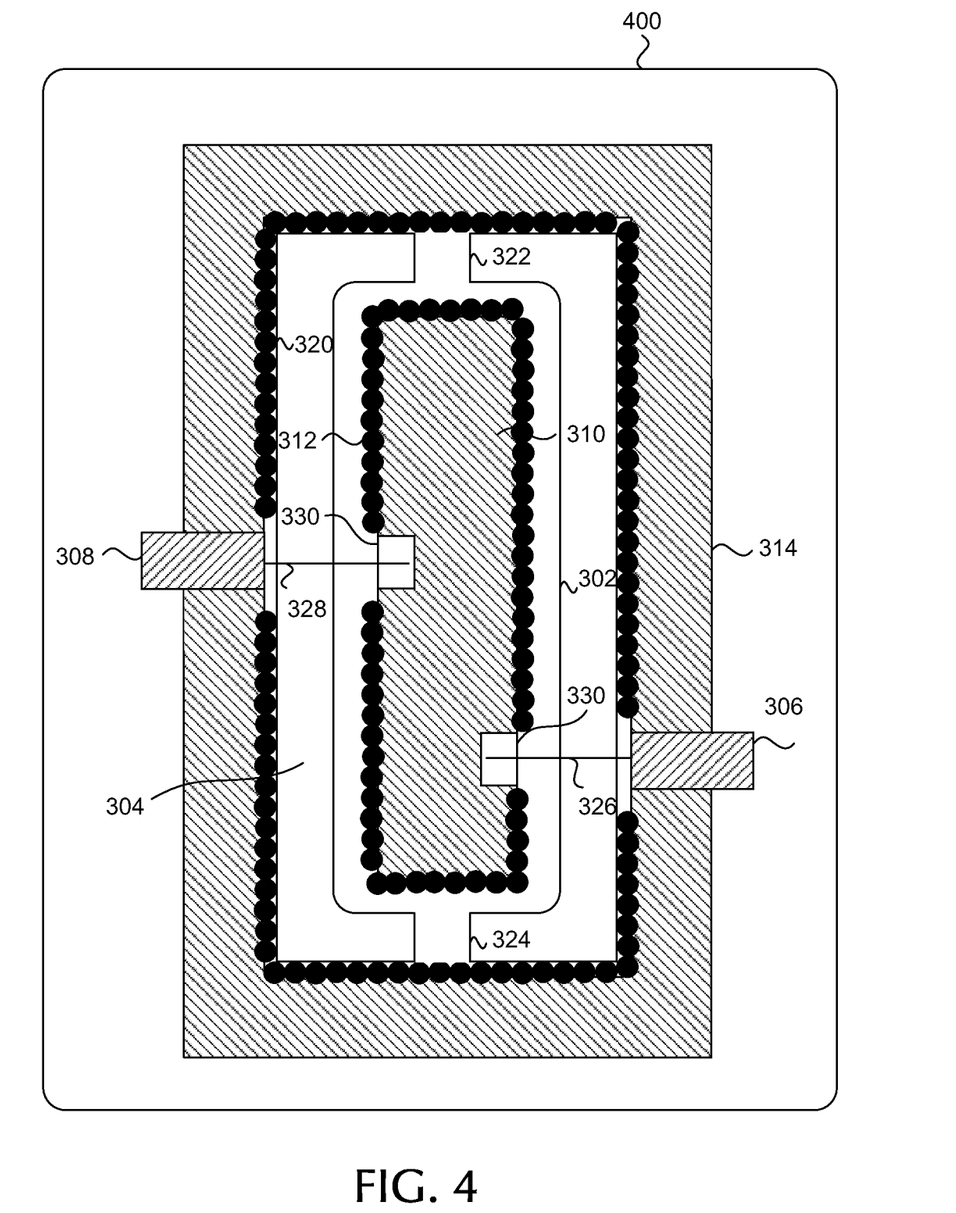
FIG. 4 is a plan view of a printed circuit board according to other embodiments of the disclosed technology.

In FIG. 4, a PCB 400 is shown similar to the PCB 300 discussed above. In this embodiment, however, the plurality of vias 312 and 320 substantially surround the entire outside perimeter of the first conductor 310 of the component connection area 302 and the perimeter of the top guard 314 of PCB 300. The remainder of the configuration of FIG. 4 is identical to that shown in FIG. 3, including the alternative embodiments discussed above.

Figure 5:
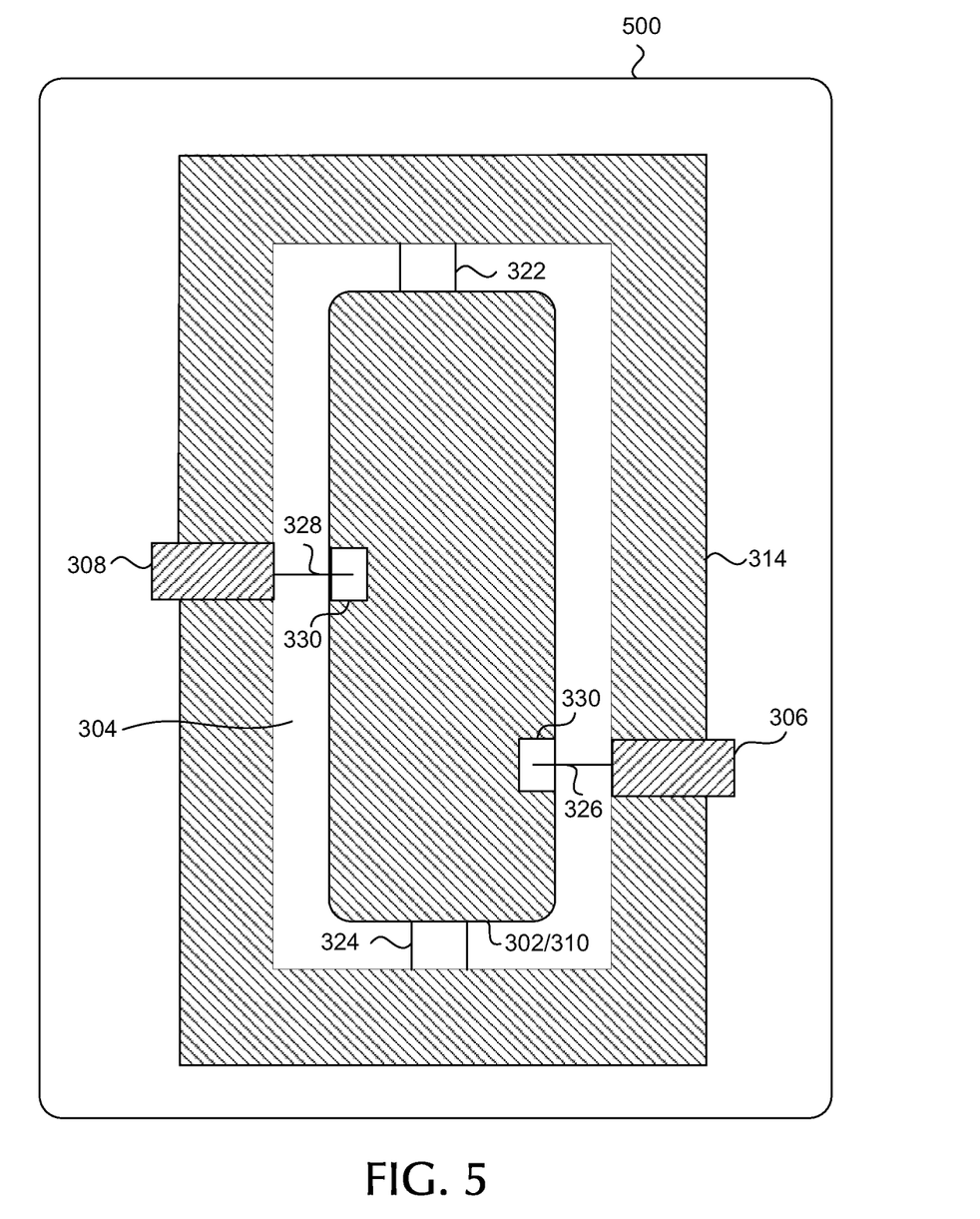
FIG. 5 is a plan view of a printed circuit board according to certain embodiments of the disclosed technology.

A PCB 500 is shown in FIG. 5 which is similar to PCBs 300 and 400 discussed above. In this embodiment, the top guard 314 covers at least substantially the entirety of the component connection area 302. The first conductor 310 also extends down the sides of the component connection area 302 and covers the bottom of the component connection area 302. That is, the first conductor 310 and the second conductor 316 form a single conductor wrapped around the component connection area 302. The top guard 314 may also coat the sides of the PCB 500 and connect with the bottom guard 318 of the PCB 500. The top guard 314 and the bottom guard 318 form a single conductor which wraps around the edge of the PCB 500 facing the aperture 304.

Figure 6:
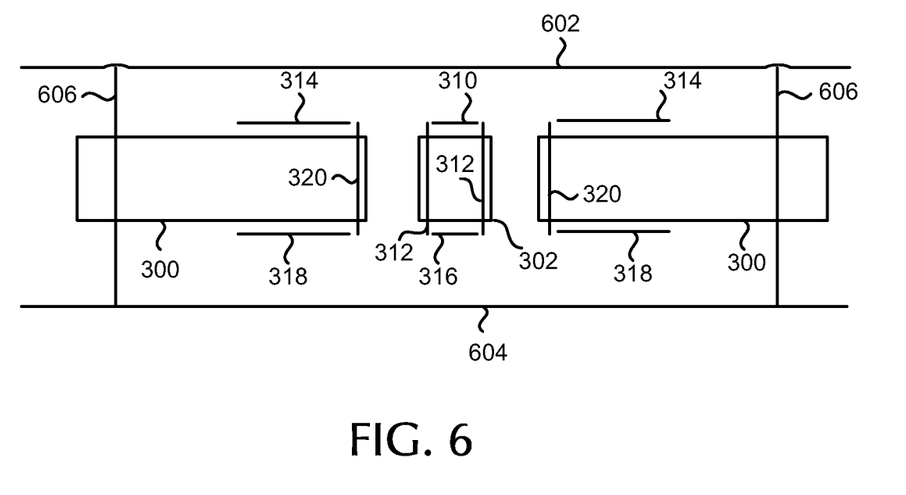
FIG. 6 is a cross-section view of a printed circuit board according to certain embodiments of the disclosed technology.

FIG. 6 depicts a cross-section view of PCB 300. In this embodiment, a top guard shield 602 and a bottom guard shield 604 may be provided covering the first conductor 310, the top guard 314, the second conductor 316 and the bottom guard 318. The top guard shield 602 and the bottom guard shield 604 would keep any E-fields coming from the component connection area 302 from seeing anything but the top guard shield 602 and the bottom guard shield 604. This would further prevent the E-fields from being absorbed by the material of the PCB 300. The top guard shield 602 and the bottom guard shield 604 should be as close to the first conductor 310, the top guard 314, the second conductor 316 and the bottom guard 318 as possible to minimize the E-field in the material of the PCB 300. The top guard shield 602 and the bottom guard shield 604 may be connected through vias 606. Although the top guard shield 602 and the bottom guard shield 604 have been shown in connection with PCB 300, one of ordinary skill in the art will readily recognize that the top guard shield 602 and the bottom guard shield 604 may be used with PCBs 400 and 500, discussed above, as well.

Figure 7:
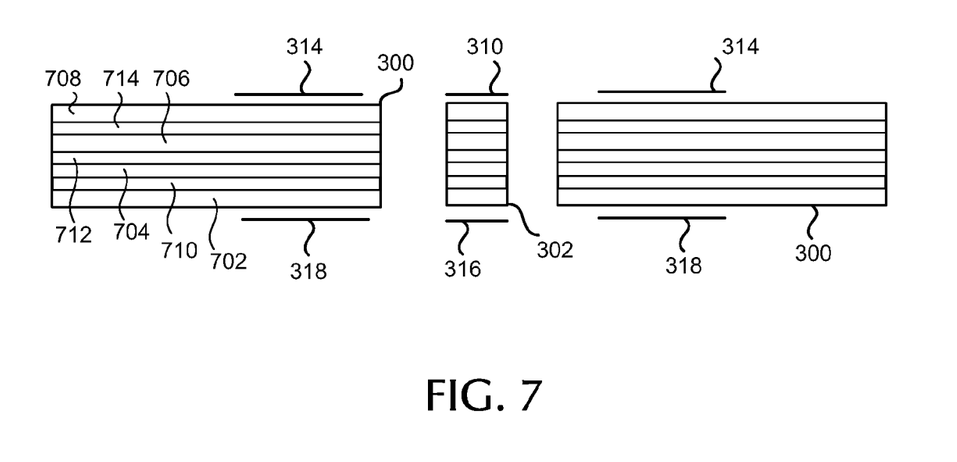
FIG. 7 is a cross-section view of a printed circuit board according to other embodiments of the disclosed technology.

Any of PCBs 300, 400, and 500 from FIGS. 3-6 and/or component connection area 302 may be a multilayered PCB. FIG. 7, for example, shows a cross-section of PCB 300 made of a four layer PCB material. Each layer 702, 704, 706, and 708 may be covered with a guard 710, 712, 714, 314 made of a conductor, as shown in FIG. 7. The bottom layer of the PCB 300 is covered with bottom guard 318. As will readily be understood by one of ordinary skill in the art and as shown in FIG. 7, the same multilayered PCB can be used as the component connection area 302 and the first conductor 310 and the second conductor 316 would be placed on the top and bottom of the multilayered PCB. In this embodiment, the amount of E-fields that enter the PCB material are even more reduced due to the guards on each layer of the PCB 500. Vias may or may not be used in this embodiment.

In each of these embodiments, the amount of E-field that is absorbed through the PCB material is very minimal. Therefore, air is mostly used as the dielectric and the settling time of the PCB material for what little E-field is absorbed into the PCB material is reduced.

Figure 8:
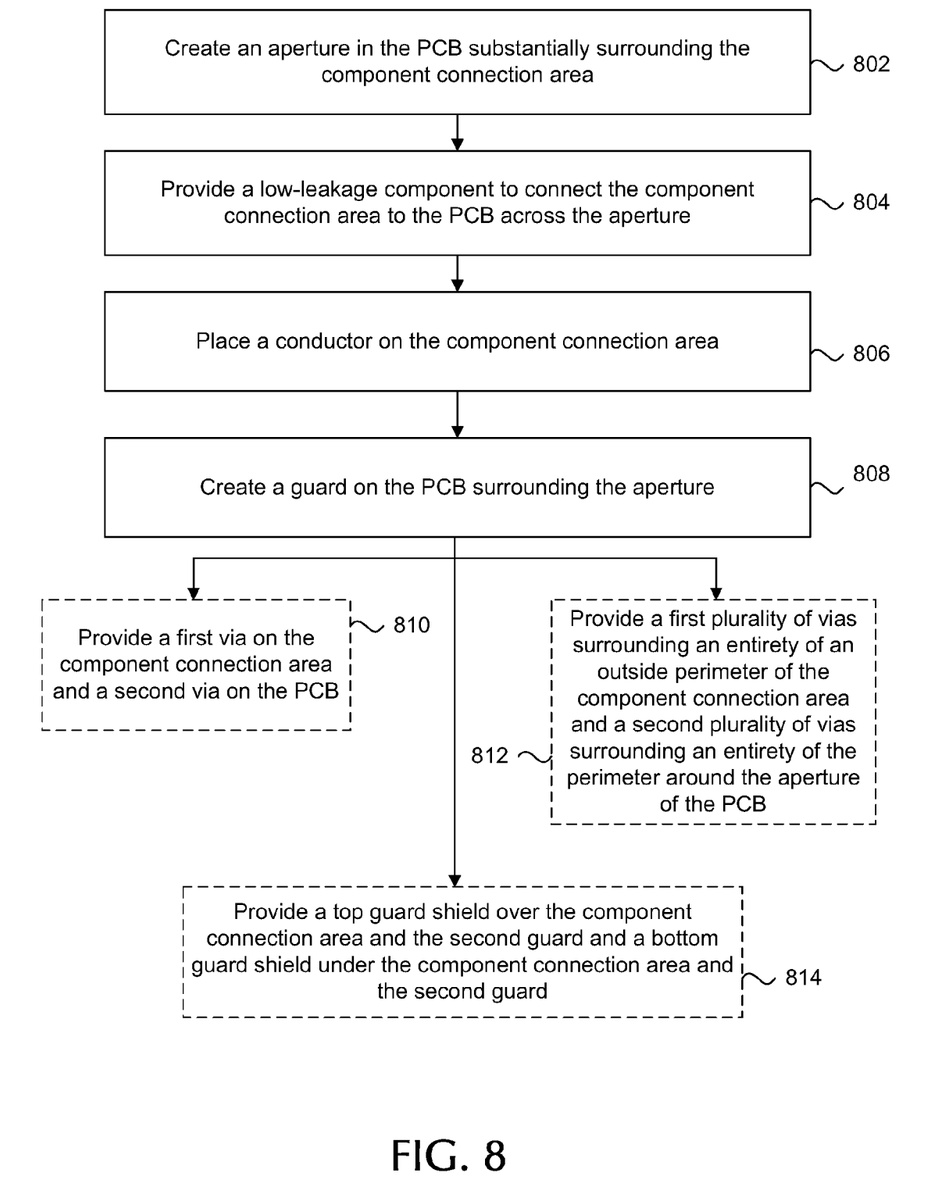
FIG. 8 is a flow chart illustrating a method of the disclosed technology.

FIG. 8 illustrates a method for providing on a printed circuit board (PCB) a component connection area of the PCB having low dielectric absorption. Initially, starting in step 802, an aperture is created in the PCB substantially surrounding the component connection area. In step 804, at least one low-leakage component to connect the component connection area to the PCB across the aperture is provided. In step 806, a first conductor is provided on a top surface of the component connection area and a second conductor is provided on a bottom surface of the component connection area. In step 808, a guard on the PCB at least substantially surrounding the aperture is created, the guard being composed of a third conductor on a top surface of the PCB and a fourth conductor on a bottom surface of the PCB.

The method may also include step 810 to provide a first via connecting the first conductor and the second conductor of the component connection area and a second via connecting the third conductor and the fourth conductor of the PCB. Or the method may include in step 812, providing a first plurality of vias surrounding the entirety of an outside perimeter of the component connection area for connecting the first conductor and the second conductor of the component connection and a second plurality of vias on the PCB surrounding an entirety of the perimeter around the aperture for connecting the third conductor and the fourth conductor of the PCB. Alternatively or in conjunction with steps 810 and 812, step 814 provides a top guard shield over the component connection area and the second guard and a bottom guard shield under the component connection area and the second guard.

The features discussed above with respect to PCBs 300, 400 and 500 may also be provided in the method such as, but not limited to, the component connection area 302 including a component electrical connection point. Further, more than one low-leakage component may be provided to structurally connect the component connection area 302 to the various PCBs 300, 400, and 500.

FIG. 9 illustrates yet other embodiments of the disclosed technology. Similar components to those discussed above with respect to PCBs 300, 400, and 500 shown in FIGS. 3, 4, and 5 are used in FIG. 9 and not further described here. FIG. 9 illustrates a PCB 900 in which the component connection area 302 or island, is in a substantially M-shape configuration. In this configuration, the PCB 900 surrounds the M-shaped island 302 on both sides, and each side of the PCB 900 includes top guards 314 and bottom guards 318 (not shown). In this embodiment, six low-leakage components 306, 308, 902, 904, 906, and 908 are used to connect the island 302 to PCB 900 through the apertures 304 via pins 326, 328, 914, 916, 918, and 920, respectively, connected at soldering points 330. The island 302 is covered in conductors 310 and 316, as discussed in the previous embodiments. Shown in FIG. 9, the entire island 302 is covered in conductors 310 and 316. The island 302, however, may only be substantially covered in conductors 310 and 316. Five connection holes 910 are provided to connect a component to the island. For example, and as shown in FIG. 9, a single connection hole 910 may be provided on the island, and four connection holes 910 may be provided on PCB 900. Although the island is shown in an substantially M-shaped configuration, it will be readily understood that any shape of island 302 may be used. Further, as shown in FIG. 9, stems 322, 324, and 912 may be used to connect the island 302 to PCB 900 as discussed in previously embodiments. This embodiment may also contain the top guard 602 and top guard 604 discussed above with respect to FIG. 6.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A device, comprising:
   a printed circuit board (PCB);
   a component connection area on the PCB including a first conductor covering a majority of a top surface of the component connection area and a second conductor covering a majority of a bottom surface of the component connection area;
   an aperture through the PCB surrounding a majority of the component connection area, the aperture having a width;
   low-leakage components connecting the component connection area to the PCB across the aperture;
   a guard composed of a third conductor surrounding a majority of the aperture on a top surface of the PCB and a fourth conductor surrounding a majority of the aperture on a bottom surface of the PCB, the third conductor and the fourth conductor each being at least as wide as the width of the aperture;
   a first via through the PCB connecting the first conductor and the second conductor of the component connection area; and
   a second via through the PCB connecting the third conductor and the fourth conductor of the PCB.

2. The device of claim 1, further comprising:
   a first plurality of vias surrounding the entirety of an outside perimeter of the component connection area for connecting the first conductor and the second conductor of the component connection area; and
   a second plurality of vias on the PCB surrounding an entirety of the perimeter around the aperture for connecting the third conductor and the fourth conductor of the PCB.

3. The device of claim 1, wherein the component connection area includes two or more component electrical connection points.

4. The device of claim 1, further comprising:
   a top guard shield over the component connection area and the guard; and
   a bottom guard shield under the component connection area and the guard.

5. The device of claim 1, wherein the PCB is a multilayered PCB composed of at least four layers with a layer of a fifth guard conductor in between each layer and a sixth guard conductor covering the side of the PCB in contact with the aperture.

6. The device of claim 5, wherein the component connection area is also a multilayered PCB of at least four layers with a layer of a fifth conductor in between each layer and a sixth conductor covering the side of the component connection area in contact with the aperture.

7. The device of claim 1, further comprising a plurality of stems connecting the component connection area to the PCB.

8. The device of claim 1, wherein the aperture is a first aperture, the device further comprising:
   a second aperture through the PCB surrounding a the component connection area, the second aperture having a width,
   wherein the third conductor and the fourth conductor are each as wide as each width of the apertures.

9. A method for providing on a printed circuit board (PCB) a component connection area of the PCB having low dielectric absorption, comprising:
   creating an aperture in the PCB completely surrounding the component connection area, the aperture having a width;
   providing a low-leakage component to connect the component connection area to the PCB across the aperture;
   providing a first conductor on a top surface of the component connection area and a second conductor on a bottom surface of the component connection area, the first conductor covering a majority of the top surface of the component connection area, and the second conductor covering a majority of the bottom surface of the component connection area; and
   creating a guard on the PCB surrounding a majority of the aperture, the guard composed of a third conductor on a top surface of the PCB and a fourth conductor on a bottom surface of the PCB, the third conductor and the fourth conductor each being at least as wide as the width of the aperture.

10. The method of claim 9, further comprising:
    providing a first via connecting the first conductor and the second conductor through the component connection area; and
    providing a second via connecting the third conductor and the fourth conductor through the PCB.

11. The method of claim 9, further comprising:
    providing a first plurality of vias surrounding the entirety of an outside perimeter of the component connection area for connecting the first conductor and the second conductor of the component connection area; and
    providing a second plurality of vias on the PCB surrounding an entirety of the perimeter around the aperture for connecting the third conductor and the fourth conductor of the PCB.

12. The method of claim 9, wherein the component connection area includes a component electrical connection point.

13. The method of claim 9, further comprising:
providing a top guard shield over the component connection area and the second guard; and
providing a bottom guard shield under the component connection area and the second guard.

14. The method of claim 9, further providing adding another low-leakage component connecting the component connection area to the PCB.

15. The method of claim 9, wherein the PCB is a multilayered PCB composed of at least four layers with a layer of a fifth conductor in between each layer and a sixth conductor covering the side of the PCB in contact with the aperture.

16. The method of claim 15, wherein the component connection area is also a multilayered PCB of at least four layers with a layer of a fifth conductor in between each layer and a sixth conductor covering the side of the component connection area in contact with the aperture.

17. A device, comprising:
a printed circuit board (PCB);
a component connection area on the PCB including a first conductor at least substantially covering a top surface of the component connection area and a second conductor at least substantially covering a bottom surface of the component connection area;
an aperture through the PCB at least substantially surrounding the component connection area;
low-leakage components connecting the component connection area to the PCB across the aperture;
a guard composed of a third conductor at least substantially surrounding the aperture on a top surface of the PCB and a fourth conductor at least substantially surrounding the aperture on a bottom surface of the PCB;
a first via through the PCB connecting the first conductor and the second conductor of the component connection area;
a second via through the PCB connecting the third conductor and the fourth conductor of the PCB;
a first plurality of vias surrounding the entirety of an outside perimeter of the component connection area for connecting the first conductor and the second conductor of the component connection area; and
a second plurality of vias on the PCB surrounding an entirety of the perimeter around the aperture for connecting the third conductor and the fourth conductor of the PCB.

* * * * *